US009600183B2

(12) United States Patent
Tomishima et al.

(10) Patent No.: US 9,600,183 B2
(45) Date of Patent: Mar. 21, 2017

(54) APPARATUS, SYSTEM AND METHOD FOR DETERMINING COMPARISON INFORMATION BASED ON MEMORY DATA

(71) Applicant: Intel Corporation, Santa Clara, CA (US)

(72) Inventors: Shigeki Tomishima, Portland, OR (US); Shih-Lien L. Lu, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 221 days.

(21) Appl. No.: 14/493,130

(22) Filed: Sep. 22, 2014

(65) Prior Publication Data

US 2016/0085443 A1    Mar. 24, 2016

(51) Int. Cl.
G06F 3/06         (2006.01)
G11C 7/10         (2006.01)
G11C 15/00        (2006.01)

(52) U.S. Cl.
CPC ............ *G06F 3/061* (2013.01); *G06F 3/0665* (2013.01); *G06F 3/0689* (2013.01); *G11C 7/1006* (2013.01); *G11C 7/1072* (2013.01); *G11C 15/00* (2013.01)

(58) Field of Classification Search
CPC ...... G06F 3/061; G06F 3/0665; G06F 3/0689; G06F 3/0659; G06F 3/0679; G11C 7/1006; G11C 15/00; G11C 7/1072
See application file for complete search history.

(56) References Cited

U.S. PATENT DOCUMENTS 6,240,003 B1    5/2001    McElroy
7,167,946 B2    1/2007    Osborne
7,188,263 B1    3/2007    Rubinstein et al.
8,817,571 B2    8/2014    Choi et al.
(Continued)

FOREIGN PATENT DOCUMENTS

WO    WO-2014085268    6/2014

OTHER PUBLICATIONS

Wirbel, Loring , "Mosaid preps DRAM-based CAM family", EE Times, Sep. 27 1999, http://www.eetimes.com/document.asp?doc_id=1140198 (Sep. 27, 1999), 3 pgs. , last accessed Sep. 22, 2014.
(Continued)

*Primary Examiner* — Zhuo Li
(74) *Attorney, Agent, or Firm* — Blakely, Sokoloff, Taylor & Zafman LLP

(57) ABSTRACT

Techniques and mechanisms for determining comparison information at a memory device. In an embodiment, the memory device receives from a memory controller signals that include or otherwise indicate an address corresponding to a memory location of the memory device. Where it is determined that the signals indicate a compare operation, the memory device retrieves data stored at the memory location, and performs a comparison of the data to a reference data value that is included in or otherwise indicated by the received signals. The memory device sends to the memory controller information representing a result of the comparison. In another embodiment, a memory controller provides signals to control a compare operation by such a memory device.

20 Claims, 8 Drawing Sheets

(56) References Cited

U.S. PATENT DOCUMENTS

| | | | |
|---|---|---|---|
| 9,317,464 B2* | 4/2016 | Cox | G06F 13/385 |
| 2005/0071567 A1* | 3/2005 | Spix | G11C 15/04 |
| | | | 711/131 |
| 2012/0254524 A1 | 10/2012 | Fujimoto | |
| 2013/0007564 A1 | 1/2013 | Bedeschi | |
| 2014/0006699 A1 | 1/2014 | Bains et al. | |
| 2014/0089574 A1 | 3/2014 | Sohn et al. | |
| 2014/0157053 A1 | 6/2014 | Mozak et al. | |
| 2014/0181615 A1* | 6/2014 | Kwok | H03M 13/2906 |
| | | | 714/755 |
| 2015/0309726 A1* | 10/2015 | McCall | G11C 5/147 |
| | | | 710/5 |

OTHER PUBLICATIONS

International Search Report and Written Opinion in PCT Application No. PCT/US2015/045638, mailed Nov. 30, 2015, 12 pages.

* cited by examiner

APPARATUS, SYSTEM AND METHOD FOR DETERMINING COMPARISON INFORMATION BASED ON MEMORY DATA

BACKGROUND

1. Technical Field

The present invention relates to memory devices and, more particularly but not exclusively, to comparing data stored by memory cells of a memory device.

2. Background Art

A content addressable memory ("CAM") typically stores data in a plurality of memory locations. The CAM may include value-matching logic that compares input data against the stored data and generates an indicator signal identifying those memory locations where the input value matches a stored value. A value match often is called a "hit." Such properties of CAM technologies have been increasingly available over the past two decades.

However, as successive generations of dynamic random access memory (DRAM), static random access memory (SRAM), etc. continue to decrease in scale and price, there is an attendant increase in demand for mechanisms, such as those of a CAM, to support efficient searching of such affordable, high-volume random access memory (RAM) types. The more wide and varied integration of device networking has also driven demand for such mechanisms.

Ternary CAM technology, which supports use of a "don't care" state in data comparisons, has been one improvement over basic binary CAM. However, the relatively large memory cell sizes of CAM devices, along with the attendant small storage capacity and expensive price, continues to be an impediment to the use of CAM in many use cases. The need for alternatives to CAM is demonstrated, for example, by the use of substitute software approaches to implement some version of CAM's memory search functionality.

BRIEF DESCRIPTION OF THE DRAWINGS

The various embodiments of the present invention are illustrated by way of example, and not by way of limitation, in the figures of the accompanying drawings and in which.

DETAILED DESCRIPTION

Embodiments discussed herein variously provide techniques and/or mechanisms for a memory device to perform a comparison of a reference value to data stored at that memory device. At least some of these techniques and/or mechanisms are a result of a realization that an opportunity exists to exploit the comparative advantages of a RAM (distinct from any CAM)—e.g., in terms of size and/or cost—to provide functionality that serves as a limited substitute for that of a CAM.

Certain embodiments are discussed herein with respect to techniques and/or mechanisms that support the performance at a DRAM device of a comparison between a reference data value (entry data) and a value stored at the DRAM device. Information describing such a comparison may then be communicated from the DRAM device to a memory controller, for example. However, such discussion may be extended to additionally or alternatively apply to such a comparison being performed at any other variety of other types of RAM including, but not limited to, static RAM (SRAM), spin transfer torque magnetoresistive RAM (STT-MRAM), resistive RAM (ReRAM) and/or the like.

Such a DRAM device may comprise an array of memory cells and access logic including circuitry configured to receive a reference data value from a host (e.g., a memory controller) that is coupled to the DRAM device. The DRAM device may compare the reference data value to a value stored in the memory array, and based on a result of the comparison, generate one or more signals indicating, for example, a hit comprising a match between the reference value and the stored data or, alternatively, a miss comprising a mismatch between the reference value and the stored data. In an embodiment, the access logic is to determine, based on signaling received from the host, whether (or not) a comparison mode of the memory device is to be configured to process address information and data received in association with such signaling.

Figure 1A:
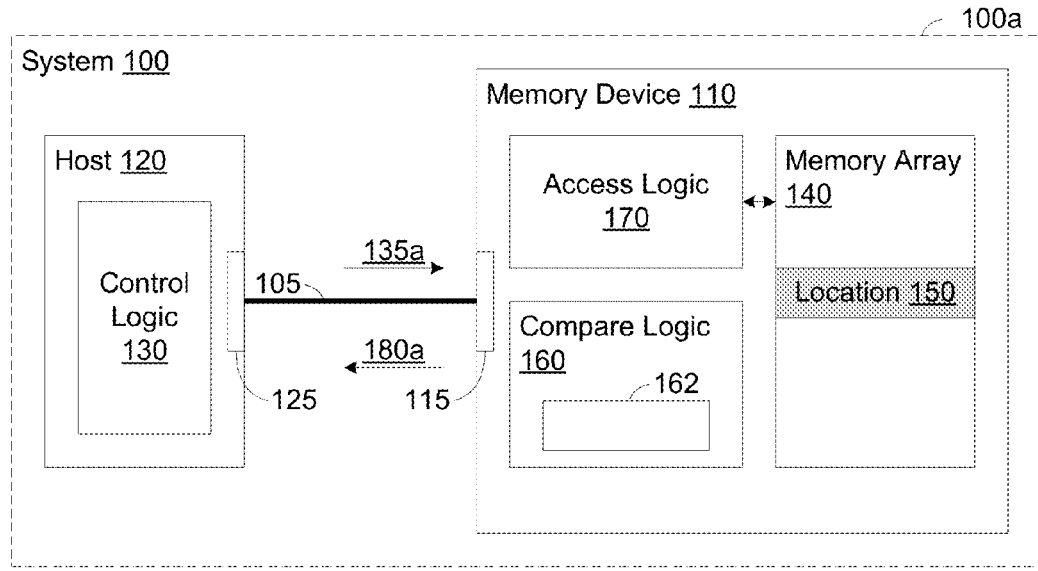
FIG. 1A is a high-level functional block diagram illustrating elements of a system for performing a read operation according to an embodiment.
Figure 1B:
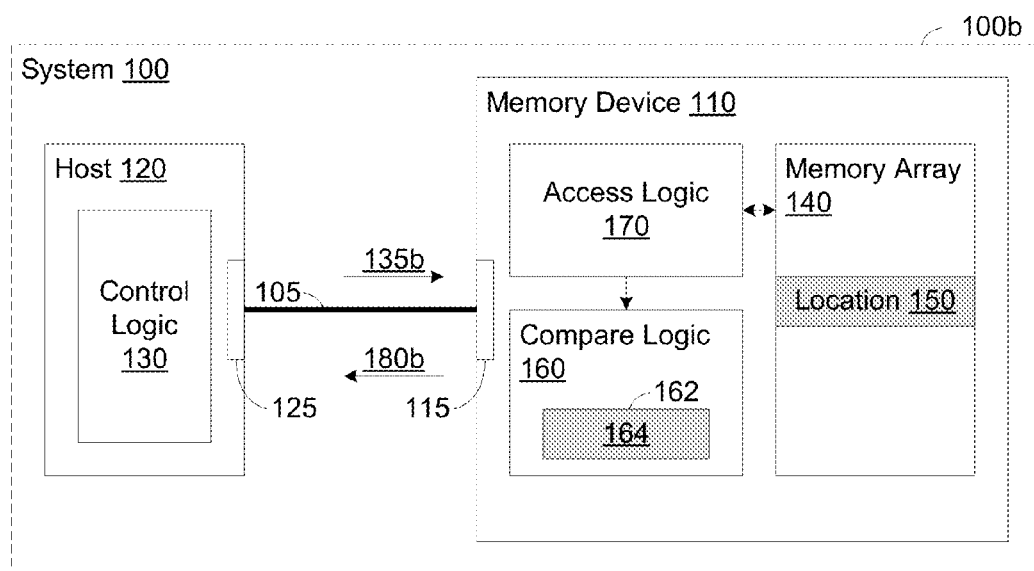
FIG. 1B is a functional block diagram illustrating elements of a system for performing a data compare operation according to an embodiment.

Certain embodiments variously provide for a memory chip (e.g, of a packaged device) to implement content-based data comparison functionality—e.g., in addition to functionality of otherwise conventional memory circuitry. FIGS. 1A and 1B variously illustrate features of a system 100 according to an embodiment. System 100 may include memory device 110 and a host 120, wherein an input/output (I/O) interface 125 of host 120 is coupled to an I/O interface 115 of memory device 110 via an interconnect 105. Host 120 may comprise a memory controller to provide access to memory device 110 for a host processor that is included in or coupled to host 120. Such a host processor may include circuitry configured to execute a general-purpose operating system and/or other software for a computer platform that includes system 100. In one embodiment, memory device 110 is an integrated circuit (IC) die other than any IC die of host 120. For example, memory device 110 may be a packaged device other than any packaged device of host 120. In another embodiment, system 100 is a system-on-chip (SoC) device.

Interconnect 105 may comprise signal lines to variously exchange signaling between host 120 and memory device 110. For example, interconnect 105 may include a data bus, an address bus, a command bus and/or any of a variety of combinations of some or all such buses in support of host 120 accessing or otherwise controlling memory device 110.

Interconnect 105 may further include one or more control signal lines for control signaling (e.g., other than command, address and/or data signaling) to memory device 110. A reader of skill in the art will appreciate that such control signal lines may communicate, for example, one or more of a chip select signal, a write enable signal, an output enable signal, a clock signal, a column address strobe signal, a row address strobe signal or any of a variety of other conventional control signals. As discussed herein, one or more control signals lines of interconnect 105 may communicate a signal specifying that memory device 110 is to perform a data compare operation (or simply "compare operation") in association with address information and/or data provided by host 120.

Memory device 110 may include any of a variety of types of memory technology that, for example, have rows of memory cells, where data is accessible via a wordline or the equivalent. In one embodiment, memory device 110 includes DRAM technology. Memory device 110 may be an IC package within a larger memory device (not shown) of system 100. For example, memory device 110 may be a DRAM device of a memory module such as a dual in-line memory module (DIMM).

Memory device 110 may include memory array 140, which represents one or more logical and/or physical groups of memory. An example of one such grouping of memory is a bank of memory resources that, for example, may include storage elements arranged in rows and columns. Memory device 110 may include access logic 170 to facilitate, at least in part, access to memory array 140—e.g. where such access is provided for servicing one or more commands from host 120. Access logic 170 may include, or operate in conjunction with, logic of memory device 110 which provides resource access according to conventional techniques—e.g. where functionality of compare logic 160 supplements such conventional techniques with additional functionality discussed herein. By way of illustration and not limitation, access logic 170 may include or couple to command logic and address logic (not shown) which are used to decode an access instruction to the proper memory location within memory array 140.

Host 120 may send commands or instructions to memory device 110 over a bus of interconnect 105. Such commands may be interpreted by memory device 110—e.g. including memory device 110 decoding command information to perform a variety of access functions within the memory and/or decoding address information with column logic and/or row logic. For example, such logic may access a specific location in memory array 140 with a combination of a column address strobe or signal (CAS) and a row address strobe or signal (RAS). Rows of memory may be implemented in accordance with known memory architectures or their derivatives. Briefly, a row of memory array 140 may include one or more addressable columns of memory cells, as identified by the CAS generated by column logic of memory 110. The rows may each be variously addressable via the RAS generated by row logic of memory 110.

A given set of signals may be sent to memory array 140 for the purpose of writing data exchanged—and/or reading data to be exchanged—via a data bus coupled to I/O interface 115. In an embodiment, host 120 includes control logic 130—e.g. including any of a variety of hardware logic and/or executing software logic—to send commands via an I/O interface 125 to interconnect 105. Control logic 130 may include or couple to logic of a memory controller which performs operations to generate, transmit or otherwise determine commands sent according to one or more conventional techniques. By way of illustration and not limitation, control logic 130 may supplement otherwise conventional command/address signaling functionality which, for example, conforms to some or all requirements of a dual data rate (DDR) specification such as the DDR3 SDRAM JEDEC Standard JESD79-3C, April 2008 or the like.

FIG. 1A represents a view 100*a* of exchanges performed by system 100 for a read access of memory array 140. As shown in view 100*a*, such exchanges may include control logic 130 sending via interconnect 105 signals 135*a* to indicate a read operation to access logic 170. Such signals 135*a* may include a read command (e.g., sent via a command bus of interconnect 105) to indicate to access logic 170 that data is to be retrieved from memory array 140 and sent to host 120. Signals 135*a* may further comprise address information (e.g., sent via an address bus of interconnect 105) specifying or otherwise indicating an address of a particular memory location (as represented by the illustrative location 150) from which such data is to be retrieved. In response to signaling 135*a*, access logic 170 may—e.g. with operations adapted from conventional read access techniques—retrieve data stored at location 150 and send the retrieved data in a response 180*a* via interconnect 105.

Generation of a read access response—such as response 180*a*—may, in one or more respects, be independent of compare logic 160 which is otherwise to participate in a compare operation such as that represented in view 100*b* of FIG. 1B. As shown in view 100*b*, control logic 130 may send via interconnect 105 signals 135*b* to indicate a compare operation to access logic 170. Such signals 135*b* may include a dedicated compare command, as distinguished from a read command, specifying that some data is to be retrieved from memory array 140 and compared to some reference value, where memory device 110 is to send to host 120 information representing a result of the comparison.

In some embodiments, signals 135*b* includes control signaling which, alone or in combination with a command of signals 135*b*, indicates to memory device 110 that some compare operation is to be performed. By way of illustration and not limitation, I/O interface 125 and I/O interface 115 may each include a respective contact (e.g., a pin, pad, ball or the like) dedicated to exchanging a control signal which specifies whether a compare operation is to be performed.

Signals 135*b* may further comprise address information which specifies or otherwise indicates an address of a targeted memory location (e.g., location 150) from which data is to be retrieved for comparison to a reference value received from host 120. A compare operation and a read operation may target different respective addressable locations of memory array 140. In an embodiment, signals 135*b* further comprise the reference value to be compared to data stored in the targeted location of memory array 110. For example, a reference value 164 may be exchanged from host 120 to memory device 110 via a data bus of interconnect 105. Reference value 164 may be stored to a repository 162 which is included in or otherwise accessible to compare logic 160.

In response to signaling 135*b*, access logic 170 may retrieve data stored at location 150 (or some other targeted location of memory array 140). The retrieved data may be provided to compare logic 160 for comparison to reference value 164. For example, in response to signals 135*b*, access logic 170 may be configured (e.g., reconfigured) to provide the retrieved data to compare logic 170 instead of, or in addition to, providing the retrieved data to I/O interface 115.

Compare logic 160 may output information representing a result of the data comparison, wherein a response 180b to host 120 includes or is otherwise based on such a data comparison. In one embodiment, response 180b includes one or more bits to indicate whether (or not) one or more bits of the stored data each match a corresponding bit of reference value 164.

Figure 2:
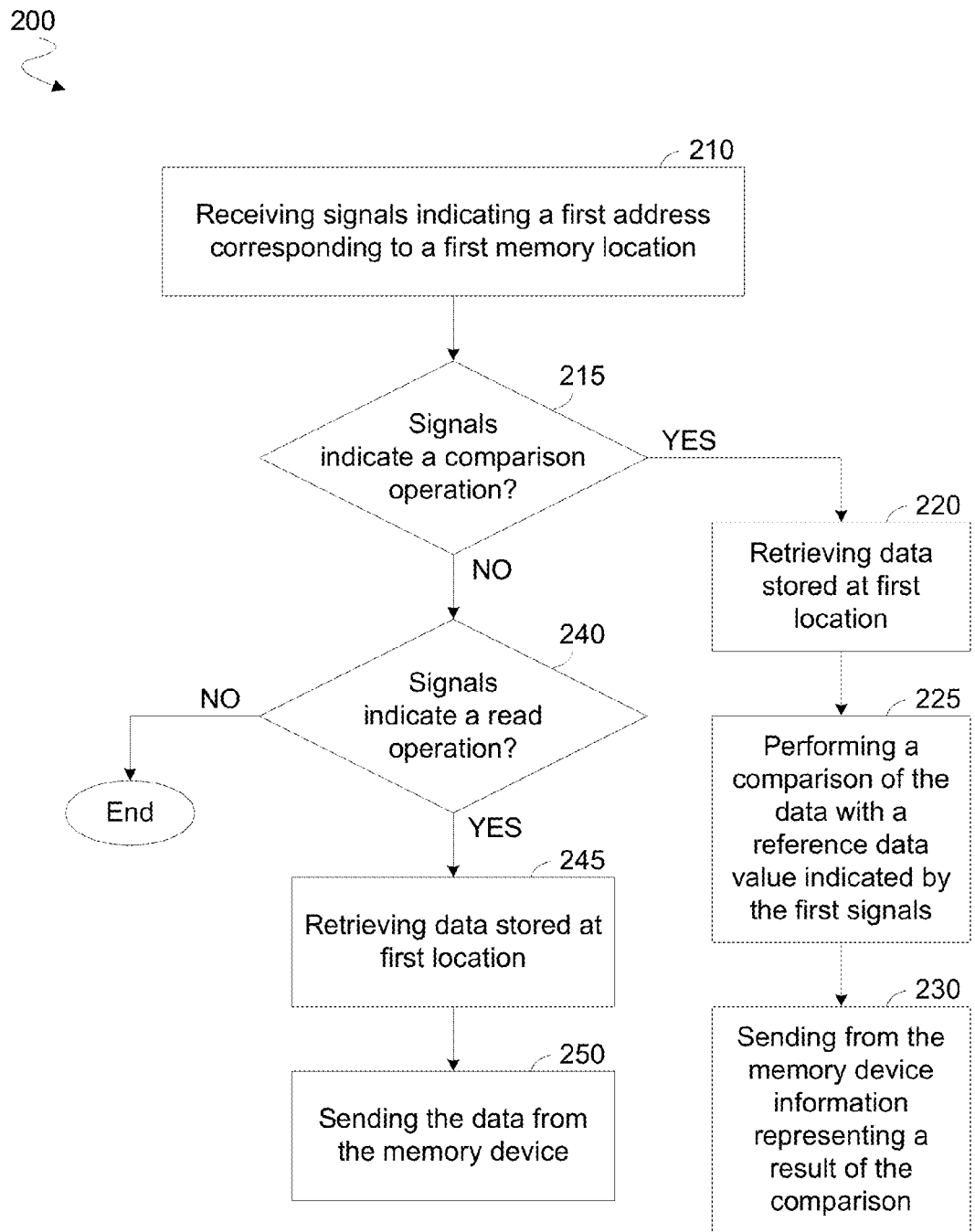
FIG. 2 is a high-level functional block diagram illustrating elements of a memory device to support a data compare operation according to an embodiment.
Figure 3:
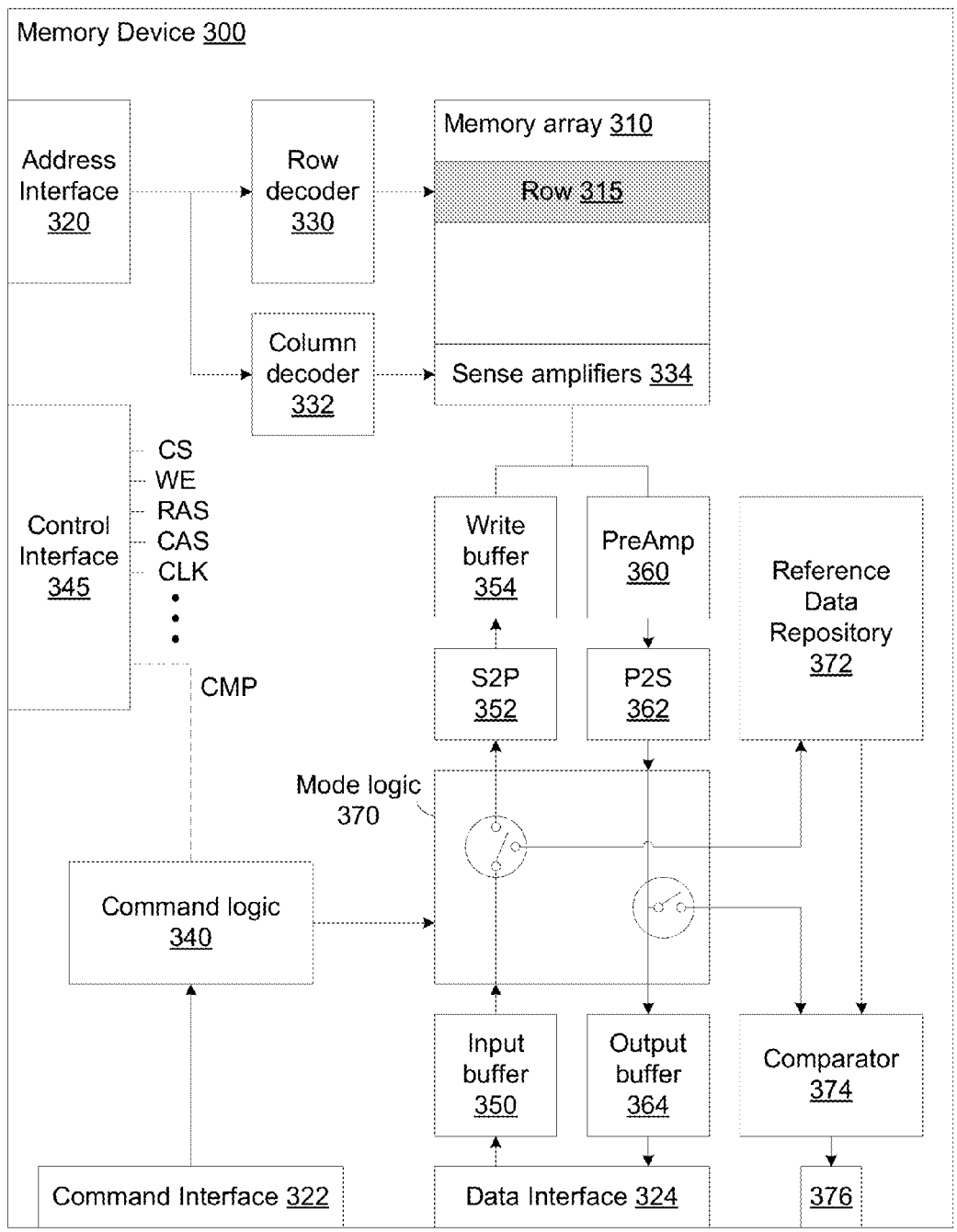
FIG. 3 is a flow illustrating elements of a method for operating a memory device according to an embodiment.

FIG. 2 illustrates elements of a method 200 of operating a memory device according to an embodiment. Method 200 may be performed by a memory including some or all of the features of memory device 110, for example. To illustrate certain features of various embodiments, method 200 is discussed herein with respect to operation of a memory device 300 illustrated in FIG. 3. However, such discussion may be extended to additionally or alternatively apply to any of a variety of memory devices, according to different embodiments, which provide compare functionality discussed herein.

Memory device 300 may include a memory array 310 comprising a plurality of memory locations each corresponding to a respective address. In an embodiment, method 200 comprises, at 210, receiving at the memory device signals that include or otherwise indicate a first address corresponding to a first memory location. Certain features of memory device 300 are now described with respect to the processing of such signals, according to method 200, to perform either of a read operation and a compare operation.

The signals may be received at 210 via I/O interface circuitry of memory device 300—e.g., where such I/O interface circuitry includes an address interface 320, a command interface 322 and/or a data interface 324 to variously couple to a memory controller (not shown) via one or more buses. The signals received at 210 may include an address for a particular addressable location of a memory array 310 (as represented by the illustrative row 315) targeted by the received signals. The signals received at 210 may further comprise a command—e.g., a read command or a compare command—of a command set used by the memory controller to control memory device 300. For some types of accesses, the signals received at 210 may further comprise data to be associated with the access to the first address. For example, such data may include data to be written to the first memory location or, alternatively, a reference data value to be compared to data stored at the first memory location. Memory device 310 may be configured to associate such address, command and/or data signals with one another based, for example, on a relative timing of such signals and/or based on control signaling (e.g., other than command, address and/or data signaling) included in or otherwise corresponding to the received signals.

Such control signaling may be received, for example, via a control interface 345 of memory device 300. Control interface 345 may comprise contacts to variously receive control signals from a host (not shown) coupled to memory device 300. Such control signals may include, for example, one or more of a chip select signal CS, a write enable signal WE, a road address strobe signal RAS, a column address strobe signal CAS, a clock signal CLK and/or the like. A reader of ordinary skill in the technology will appreciate that such control signals may be according to or adapted from conventional memory control techniques, the details of which are not discussed herein and are not limiting on certain embodiments.

Although certain embodiments or not limited in this regard, otherwise conventional control signaling may be modified or extended to further indicate to memory device 300 when an address is to be associated with a compare access (e.g., as contrasted with a read access) to memory array 310. For example, in some embodiments, control interface 345 receives compare control signaling which specifies that an associated address and data received by memory device 300 are for the purpose of memory device 300 performing a compare operation. Such compare control signaling may be communicated by any of the variety of techniques, according to different embodiments. For example, a dedicated compare control signal CMP may be received via a contact of control interface 345 that only communicates whether (or not) a compare operation is to be performed. Alternatively, compare control signaling may be received via one or more contacts of control interface 345 which also communicate different types of control information at various times. By way of illustration and not limitation, a compare operation may be indicated by a RAS contact, a CAS contact, a WE contact and/or another contact of control interface 345 receiving a particular signal value (for example, logic high or logic low) or a sequence of signal values that, due to the timing, sequence and/or combination of such signals, are recognized by memory device 300 as being indicative that a compare command operation is to be performed.

In one embodiment, compare control signaling such as that of signal CMP may be provided to command logic 340 of memory device 300. Such compare control signaling may indicate a compare operation as a modifier to a command—e.g., a read command—received via command interface 322, or alternatively to signal a compare operation as an exception for an absence of any command being received via command interface 322. However, other embodiments indicate a compare operation to memory device 300 by means other than any explicit control signal mechanisms. For example, command logic 340 of memory device 300 may receive via command interface 322 a dedicated compare command explicitly indicating that a compare operation is to be performed. In such an embodiment, no additional control signaling such as signal CMP is present to indicate that a compare operation is to be performed.

Access logic of memory device 300 may further comprise an input path including circuitry to communicate data for writing to memory array 310. Such access logic may further include an output path comprising circuitry to communicate data that has been retrieved from memory array 310—e.g., for a host to read such retrieved data. By way of illustration and not limitation, input path circuitry of memory device 300 may include an input buffer 350 to temporarily store data received via data interface 324, a serial-to-parallel converter S2P 352 and a write buffer 354 coupled to output data to sense amplifiers 334. Alternatively or in addition, output path circuitry of memory device 300 may include a pre-amplifier PreAmp 360 coupled to receive data from sense amplifiers 334, a parallel-to-serial converter P2S 362 and an output buffer 364 to temporarily store data prior to being sent to data interface 324. However, such input path circuitry and output path circuitry is merely illustrative of one implementation, and not limiting on certain embodiments. Operation of such circuitry may be adapted from conventional memory access mechanisms, which are not detailed herein to avoid obscuring features of certain embodiments.

Memory device 300 may further comprise circuitry, as represented by the illustrative mode logic 370, to variously configure (e.g., reconfigure) input path circuitry and/or output path circuitry of memory device 300 to accommodate the performance a compare operation—as contrasted from a read operation, for example. Mode logic 370 may be coupled to facilitate and/or modify communication of data along at least part of the input path from data interface 324 to memory array 310—e.g., wherein circuitry of mode logic 370 is coupled between input buffer 350 and S2P 352. Where a write access to memory array 310 is to take place, mode logic 370 may (e.g., in response to command logic 340) decouple from, configure or otherwise allow one or more data communication paths from input buffer 350 and S2P 352. By contrast, to facilitate a comparison operation at memory array 310, mode logic 370 may instead configure a path for reference data to be exchanged from data interface 324 to reference data repository 372—i.e., in lieu of such reference data being directed for writing to memory array 310.

Alternatively or in addition, mode logic 370 may be coupled to facilitate and/or modify communication of data along at least part of the output path from memory array 310 to data interface 324—e.g., wherein circuitry of mode logic 370 is coupled between P2S 362 and output buffer 364. Where a read access of memory array 310 is to take place, mode logic 370 may (e.g., in response to command logic 340) decouple from, configure or otherwise allow one or more communication paths for retrieved data to be exchanged from P2S 362 to output buffer 364. By contrast, to facilitate a comparison operation at memory array 310, mode logic 370 may configure a path for such retrieved data to be additionally or alternatively communicated to comparator 374 for comparison with reference data stored to reference data repository 372. The configurability of such various paths are represented functionally in FIG. 3 as switch elements of mode logic 370. However, any of a variety of conventional switches or other such configuration circuitry may be adapted to provide such functionality, according to different embodiments.

In one embodiment, mode logic 370 is responsive to signaling received from command logic 340, where such signaling may indicate a particular one of a read operation and a compare operation. However, in another embodiment, mode logic 370 may be responsive to any of variety of additional or alternative signals, such as signal CMP or other such compare control signaling. Mode logic 370 may comprise switch logic and/or other configuration circuitry to set a mode whereby data being communicated along the input path from memory array 310 is to be communicated to a comparator 374—e.g. in addition to or in lieu of being communicated to data interface 324. Alternatively or in addition, such a mode may be for data being communicated along the output path away from data interface 324 to be communicated to a reference data repository 372—e.g. in lieu of being written to memory array 310.

Method 200 may comprise determining whether a compare operation is to be performed in response to the signals received at 210—e.g. including selecting from one of a plurality of access types including a compare access and a read access (which is distinguished from a compare access). In order to illustrate features of a compare access to memory, method 200 is shown as optionally performing either of a compare access and a read access. However, it is understood that certain embodiments merely perform a compare access. By way of illustration and not limitation, method 200 may include, at 215, determining whether the signals received at 210 are indicative of some compare operation to be performed. Method 200 may further comprise determining, at 240, whether the signals received at 210 are indicative of some read operation to be performed. The determining at 215 and/or the determining at 240 may be performed by access logic of memory device 300 (such as command logic 340) based on a command and/or compare control signaling included in the signals received at 210. The particular sequence of the determining at 215 and the determining at 240 is merely illustrative, and not limiting on certain embodiments.

Where it is determined at 215 that a comparison operation is to be performed based on the received signals, method 400 may initiate performance of such a comparison operation. For example, method 200 may include, at 220, retrieving data stored at the first memory location. The retrieving at 220 may include one or more operations which are also performed for a read access—e.g. according to conventional techniques. By way of illustration and not limitation, retrieval of data from a targeted row 315 may include a row decoder 330 and a column decoder 332 receiving respective address information of the received signals. Decoders 330, 332 may variously decode such address information to generate signals for activation of memory cells which comprise row 315. Based on such decoded address information, sense amplifiers 334 of memory device 300 may generate signals representing bit values variously stored in some or all memory cells of row 315.

In response to detecting of a comparison operation (as at 215), mode logic 370 may be signaled to configure a mode for the comparison operation (or to maintain such a mode). Such configuration may include establishing a path to store to reference data repository 372 an entry data value, received via data interface 324, which is included in the signals received at 210. Such configuration may further comprise establishing a path to send to comparator 374 the data retrieved from the targeted row 315.

Method 200 may further comprise, at 225, performing—e.g., based on the configuration by mode logic 370—a comparison of the data retrieved at 220 and a reference data value which is included in the received signals. In a scenario wherein the signals received at 210 are not for a comparison operation (e.g., where they are instead for a read operation), the signals may not include any such reference data value. Based on the comparison performed at 225, method 400 may, at 230, send from the memory device information representing a result of the comparison.

In one embodiment, such comparison result information includes only a single bit value which the host is configured to recognize as indicating whether (or not) the reference data value and the stored value are equal to one another. In another embodiment, the result includes multiple bits of comparison information. For example, the comparison performed at 225 may include comparing an eight-bit stored data value X[0:7] to an eight-bit reference data value Y[0:7]. In such an embodiment, a result of the comparison may be an eight-bit value Z[0:7] each bit of which indicates whether corresponding bits of X[0:7] and Y[0:7] are equal to one another. By way of illustration and not limitation, Z[0] may be equal to $(X[0] \oplus Y[0])$, Z[1] equal to $(X[1] \oplus Y[1])$, etc. Any of a variety of additional or alternative types of comparisons may be performed 225 and/or comparison result information sent at 230, according to different embodiments. Some or all comparison result information may be sent at 230 via a dedicated Match/Miss output 376, for example. Alternatively, some or all comparison result information may be communicated via other means, such as data interface 324.

In some embodiments, method 200 further comprises operations to implement an access other than a compare access. For example, where it is determined at 240 that a read operation is to be performed based on the received signals, method 200 may initiate performance of such a read operation. Otherwise, method 200 may end or, alternatively, perform operations (not shown) to implement some memory access other than a compare access or a read access.

Performance of a read access may include, at 245, retrieving the data stored at the first memory location. The retrieving at 220 may include one or more data retrieval operations such as those otherwise performed at 220. In response to detecting of a read operation (as at 240), mode logic 370 may be signaled to configure a mode for the read operation (or to maintain such a mode). Such configuration may include establishing a path which communicatively couples sense amplifiers 334 to provide the retrieved data to data interface 324. Method 200 may further comprise, at 250, sending from the memory device the data read from the first memory location. Such a read operation may be distinguished from a compare operation at least insofar as the read operation may be performed independent of any comparison being performed at memory device 300. Although certain embodiments are not limited in this regard, a compare operation may further comprise communicating the stored data value to a host. In such an embodiment, the compare operation may be considered one type of read operation (which also determines comparison information at the memory device) that is to be distinguished from another type of read operation (which foregoes determining such comparison information at the memory device).

Figure 4:
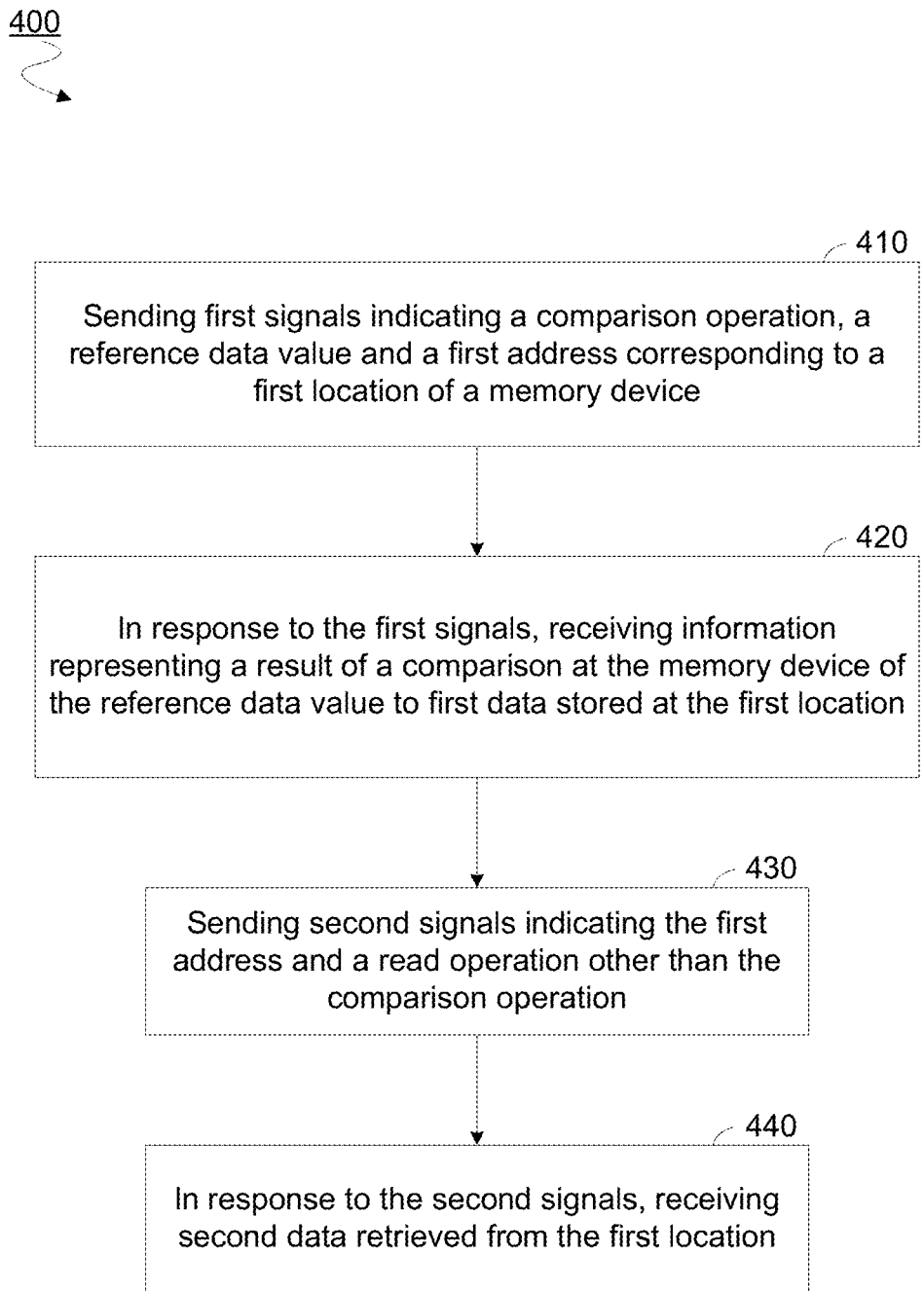
FIG. 4 is a high-level functional block diagram illustrating elements of a memory controller to exchange comparison result information according to an embodiment.
Figure 5:
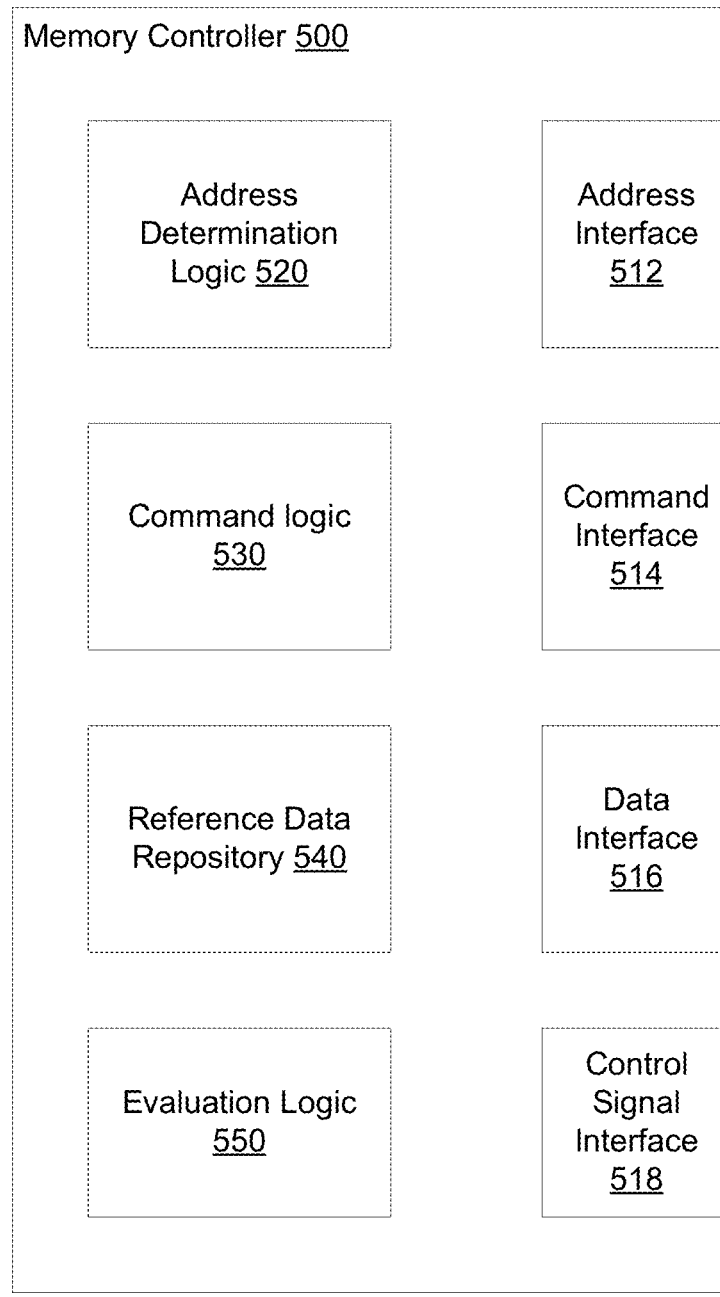
FIG. 5 is a flow diagram illustrating elements of a method for controlling a memory device according to an embodiment.

FIG. 4 illustrates elements of a method 400 for controlling a memory device according to an embodiment. Method 400 may be performed to control a memory device which provides some or all of the functionality of memory device 110—e.g., where method 400 is performed by control logic 130. A memory device controlled according to method 400 may itself perform method 200, in one embodiment. To illustrate certain features of various embodiments, method 200 is discussed herein with respect a memory controller 500 illustrated in FIG. 5. However, such discussion may be extended to additionally or alternatively apply to any of a variety of host devices which control a memory device to determine comparison information as discussed herein.

In an embodiment, method 400 comprises, at 410, sending to a memory device first signals indicating a compare operation, a reference data value and a first address corresponding to a first location of a memory array of the memory device. In the illustrative embodiment of memory controller 500, I/O circuitry includes an address interface 512 to send or otherwise indicate the first address, and a data interface 516 to send or otherwise indicate the reference data value. Address determination logic 520 and a reference data repository 540 may provide the first address and reference data value—e.g., in response to a memory access request from a central processing unit or other host logic (not shown) coupled to or integrated with memory controller 500. In some embodiments, the compare operation may be indicated by command signals exchanged via the command interface 514 and/or by one or more compare control signals exchanged via the control signal interface 518. Command logic 530 of memory controller 500 may generate such command signals based on a memory access request from the host logic. Certain embodiments are not limited with respect to a particular technique by which memory controller 500 determines a particular address and/or reference value for performing a compare operation.

The first signals sent at 410 may correspond, for example, to signals that are determined at 215 to indicate a comparison operation. Based on the first signals, the memory device performs a comparison of the reference data value and data stored at the first location. Method 400 further comprises, at 420, receiving from the memory device, in response to the first signals, information representing a result of the comparison performed at the memory device. In one embodiment, evaluation logic 550 may process such information to determine, for example, whether additional compare operations need to be performed. Such processing may include evaluation logic 550 determining whether a subsequent compare operation is to target a different memory location and/or whether a subsequent compare operation is to be based on a different reference data value. The particular details of such processing may depend on implementation-specific requirements, and are not limiting on certain embodiments.

Although certain embodiments are not limited in this regard, method 400 may further comprise additional operations to implement a read access (or other access) of the memory device. By way of illustration and not limitation, method 400 may further comprise, at 430, sending second signals to the memory device, the second signals indicating the first address (or alternatively, an address for another memory location) and a read operation other than the compare operation. Alternatively, the second signals sent at 430 may target for the read access an address of the memory other than the first address. In response to the second signals, the memory device may retrieve second data stored at the first location. The second data may be the first data targeted by the first signals sent at 410, although certain embodiments are not limited in this regard. In an embodiment, method 400 further comprises, at 440, receiving the second data from the memory device in response to the second signals.

Figure 6:
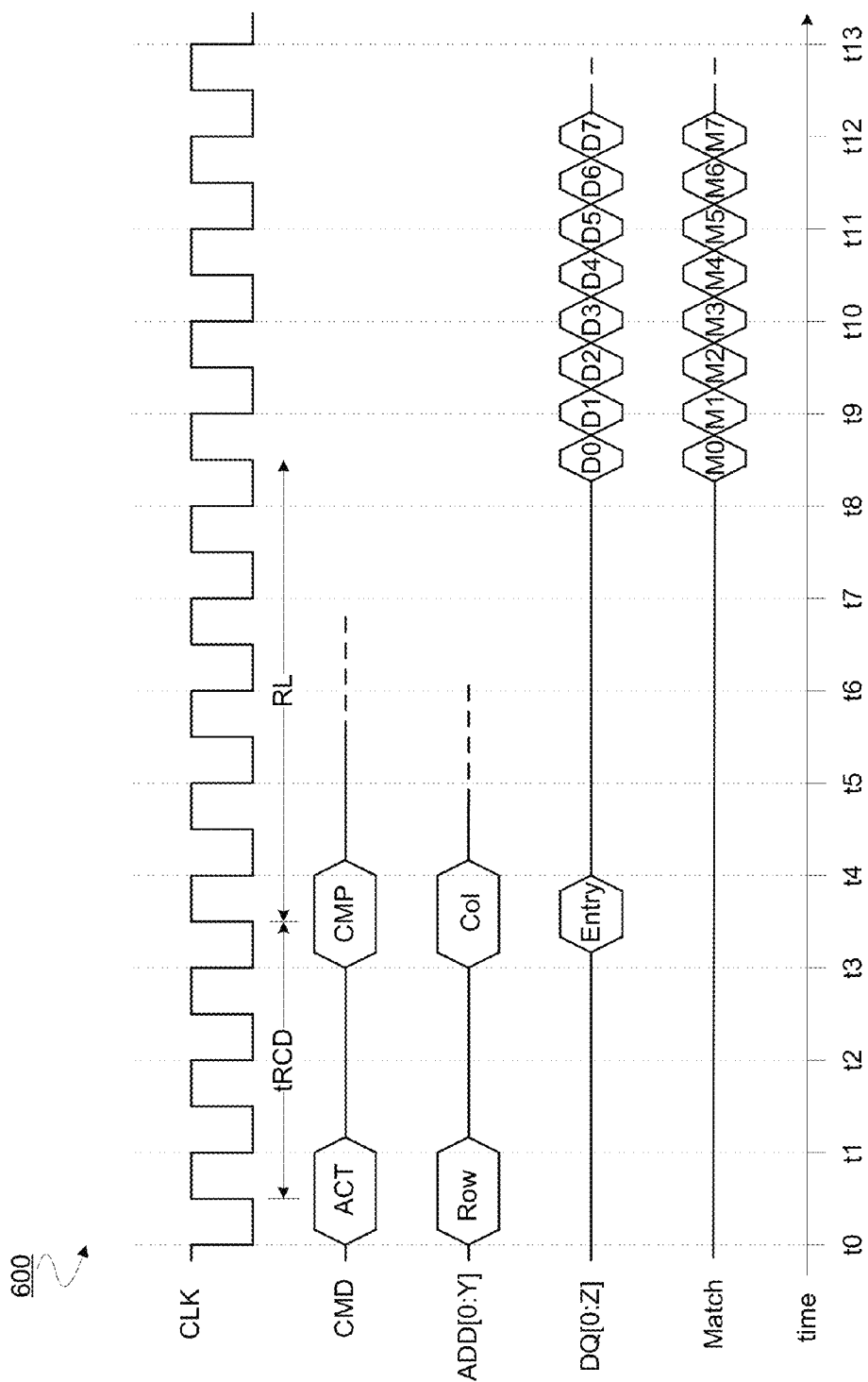
FIG. 6 is a timing illustrating elements of signal exchanges to determine comparison result information according to an embodiment.

FIG. 6 shows a timing diagram 600 illustrating signal exchanges between a memory controller and a memory device according to an embodiment. The signaling represented in timing diagram 600 may be exchanged, for example, between control logic 130 (e.g., a memory controller) and memory device 110.

In timing diagram 600, a clock signal CLK regulates a timing of the memory device. Command signaling CMD of timing diagram 600 represents one or more command signals such as those exchanged with command interface 322 and/or command interface 514, and address signaling of a (Y+1) bit address bus ADD[0:Y] represents one or more address signals such as those exchanged via address interface 320 and/or address interface 512. Commands of CMD may be communicated using a combination of one or more dedicated command signal contacts and, in some embodiments, one or more additional control signal contacts (e.g., including RAS, CAS, WE and/or the like). Data signaling of a (Z+1) bit data bus DQ[0:Z] of timing diagram 600 represents data signals such as those exchanged via data interface 324 and/or data interface 516.

At a time t0, command signaling CMD communicates an activation command (ACT) in preparation for DRAM cells of the memory device to be accessed. The ACT command may coincide with row address information (Row) being communicated by the signaling ADD. A compare command CMP may be subsequently communicated by command signaling CMD—e.g., where CMP is timed to allow for expiration of a timing constraint tRCD. In an embodiment, tRCD is a minimum time required between a memory controller asserting a row address and a subsequent asserting of a column address. In the example of timing diagram 600, the tRCD constraint requires subsequent column address information (Col) to be asserted no sooner than a rising edge of CLK which is between time t3 and time t4.

Command signaling CMD may include a compare command CMP which, for example, is communicated concurrently with the column address signaling Col. A reference data value (Entry) may also be sent as part of data signaling of DQ[0:Z]—e.g., also concurrently with CMP. After a read latency period (RL), comparison result information may be transmitted by the memory device. The period RL is determined by the time it takes for the memory device to configure a data comparison mode, retrieve data from a memory location targeted by Row and Col, and to compare such data to the reference data value Entry. Although certain embodiments are not limited in this regard, the comparison result information may be communicated by a dedicated output Match which is distinct from the signal lines for exchanging data signals of DQ[0:Z]. By way of illustration and not limitation, a sequence of Match bits including bits M0, M1, . . . , M7 may each specify whether (or not) a respective pair of bits—including a bit of stored data and a corresponding bit of reference data—are equal to one another. In another embodiment, DQ[0:Z] may be used to communicate other such comparison result information, error correction information and/or the like. In the illustrative embodiment shown in timing diagram 600, DQ[0:Z] is used to read out to the host the data bits—e.g, including bits D0 though D7—that have been retrieved from the memory array.

Figure 7:
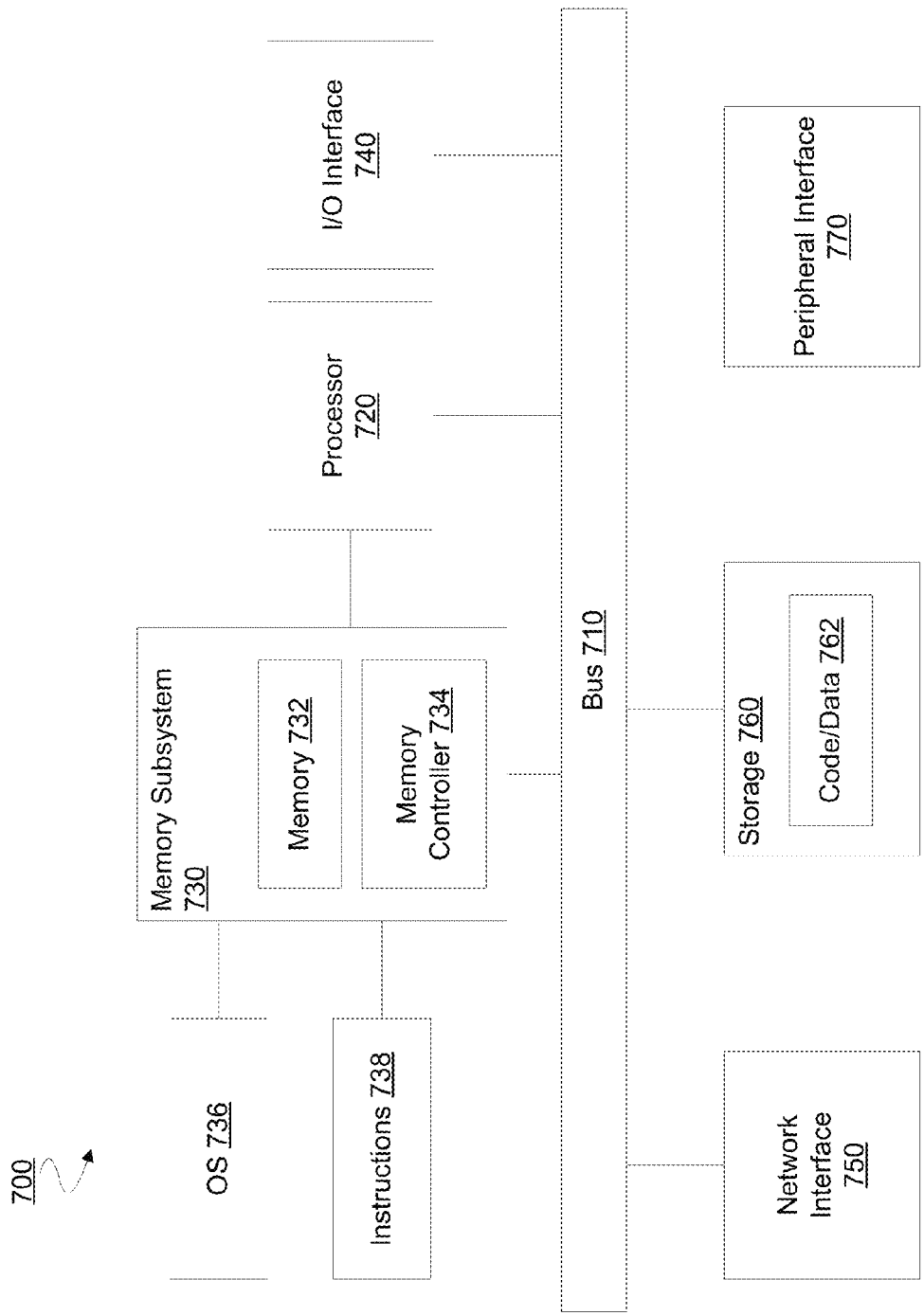
FIG. 7 is a block diagram illustrating elements of a computing system for accessing memory resources according to an embodiment.

FIG. 7 is a block diagram of an embodiment of a computing system in which a memory compare access may be implemented. System 700 represents a computing device in accordance with any embodiment described herein, and may be a laptop computer, a desktop computer, a server, a gaming or entertainment control system, a scanner, copier, printer, or other electronic device. System 700 may include processor 720, which provides processing, operation management, and execution of instructions for system 700. Processor 720 may include any type of microprocessor, central processing unit (CPU), processing core, or other processing hardware to provide processing for system 700. Processor 720 controls the overall operation of system 700, and may be or include, one or more programmable general-purpose or special-purpose microprocessors, digital signal processors (DSPs), programmable controllers, application specific integrated circuits (ASICs), programmable logic devices (PLDs), or the like, or a combination of such devices.

Memory subsystem 730 represents the main memory of system 700, and provides temporary storage for code to be executed by processor 720, or data values to be used in executing a routine. Memory subsystem 730 may include one or more memory devices such as read-only memory (ROM), flash memory, one or more varieties of random access memory (RAM), or other memory devices, or a combination of such devices. Memory subsystem 730 stores and hosts, among other things, operating system (OS) 736 to provide a software platform for execution of instructions in system 700. Additionally, other instructions 738 are stored and executed from memory subsystem 730 to provide the logic and the processing of system 700. OS 736 and instructions 738 are executed by processor 720.

Memory subsystem 730 may include memory device 732 where it stores data, instructions, programs, or other items. In one embodiment, memory subsystem includes memory controller 734, which is a memory controller in accordance with any embodiment described herein, and which receives comparison result information calculated at memory 732.

Processor 720 and memory subsystem 730 are coupled to bus/bus system 710. Bus 710 is an abstraction that represents any one or more separate physical buses, communication lines/interfaces, and/or point-to-point connections, connected by appropriate bridges, adapters, and/or controllers. Therefore, bus 710 may include, for example, one or more of a system bus, a Peripheral Component Interconnect (PCI) bus, a HyperTransport or industry standard architecture (ISA) bus, a small computer system interface (SCSI) bus, a universal serial bus (USB), or an Institute of Electrical and Electronics Engineers (IEEE) standard 1394 bus (commonly referred to as "Firewire"). The buses of bus 710 may also correspond to interfaces in network interface 750.

System 700 may also include one or more input/output (I/O) interface(s) 740, network interface 750, one or more internal mass storage device(s) 760, and peripheral interface 770 coupled to bus 710. I/O interface 740 may include one or more interface components through which a user interacts with system 700 (e.g., video, audio, and/or alphanumeric interfacing). Network interface 750 provides system 700 the ability to communicate with remote devices (e.g., servers, other computing devices) over one or more networks. Network interface 750 may include an Ethernet adapter, wireless interconnection components, USB (universal serial bus), or other wired or wireless standards-based or proprietary interfaces.

Storage 760 may be or include any conventional medium for storing large amounts of data in a nonvolatile manner, such as one or more magnetic, solid state, or optical based disks, or a combination. Storage 760 holds code or instructions and data 762 in a persistent state (i.e., the value is retained despite interruption of power to system 700). Storage 760 may be generically considered to be a "memory," although memory 730 is the executing or operating memory to provide instructions to processor 720. Whereas storage 760 is nonvolatile, memory 730 may include volatile memory (i.e., the value or state of the data is indeterminate if power is interrupted to system 700).

Peripheral interface 770 may include any hardware interface not specifically mentioned above. Peripherals refer generally to devices that connect dependently to system 700. A dependent connection is one where system 700 provides the software and/or hardware platform on which operation executes, and with which a user interacts.

Figure 8:
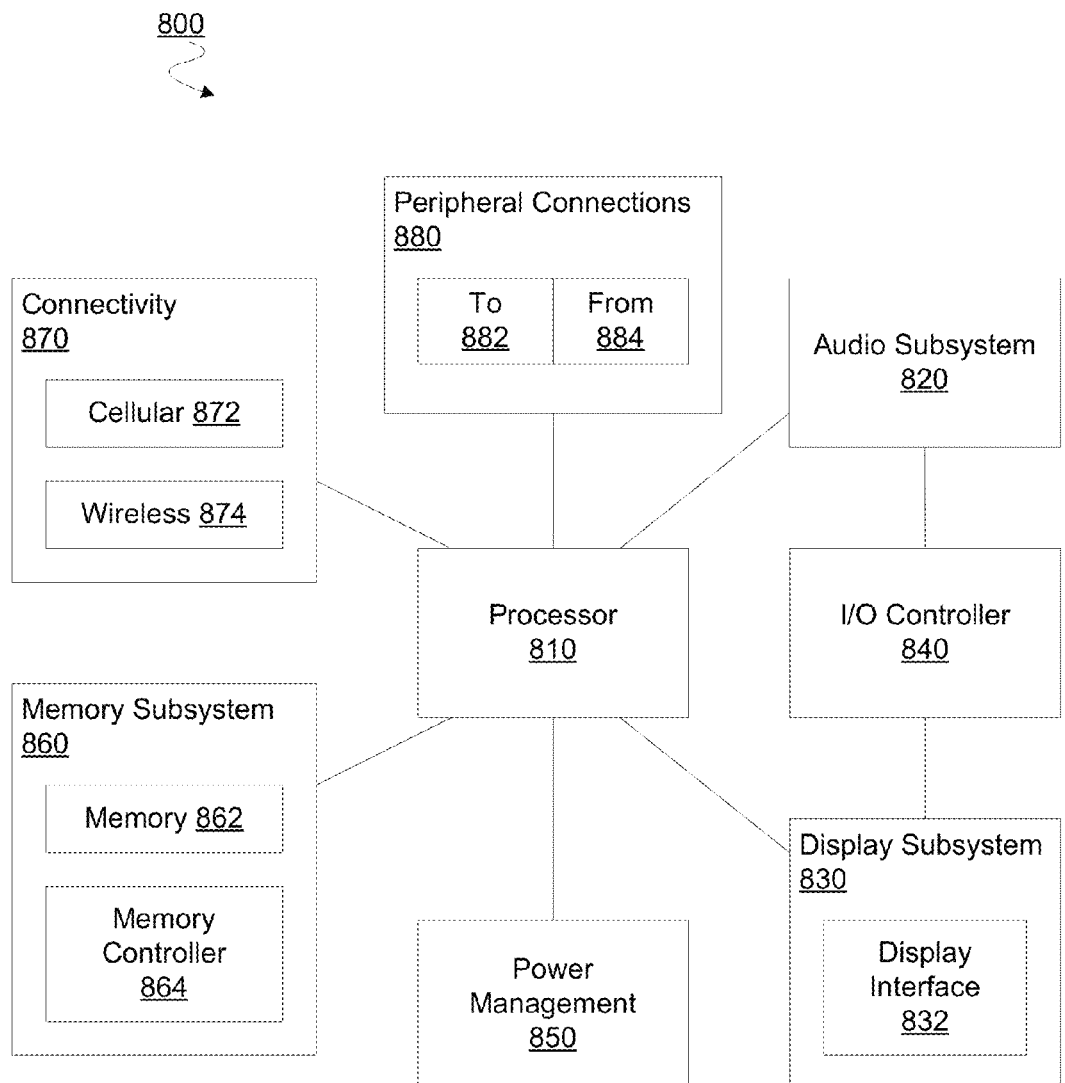
FIG. 8 is a block diagram illustrating elements of a mobile device for accessing memory resources according to an embodiment.

FIG. 8 is a block diagram of an embodiment of a mobile device in which a compare access to a memory may be implemented. Device 800 represents a mobile computing device, such as a computing tablet, a mobile phone or smartphone, a wireless-enabled e-reader, or other mobile device. It will be understood that certain of the components are shown generally, and not all components of such a device are shown in device 800.

Device 800 may include processor 810, which performs the primary processing operations of device 800. Processor 810 may include one or more physical devices, such as microprocessors, application processors, microcontrollers, programmable logic devices, or other processing means. The processing operations performed by processor 810 include the execution of an operating platform or operating system on which applications and/or device functions are executed. The processing operations include operations related to I/O (input/output) with a human user or with other devices, operations related to power management, and/or operations related to connecting device 800 to another device. The processing operations may also include operations related to audio I/O and/or display I/O.

In one embodiment, device 800 includes audio subsystem 820, which represents hardware (e.g., audio hardware and audio circuits) and software (e.g., drivers, codecs) components associated with providing audio functions to the computing device. Audio functions may include speaker and/or headphone output, as well as microphone input. Devices for such functions may be integrated into device 800, or connected to device 800. In one embodiment, a user interacts with device 800 by providing audio commands that are received and processed by processor 810.

Display subsystem 830 represents hardware (e.g., display devices) and software (e.g., drivers) components that provide a visual and/or tactile display for a user to interact with the computing device. Display subsystem 830 may include display interface 832, which may include the particular screen or hardware device used to provide a display to a user. In one embodiment, display interface 832 includes logic separate from processor 810 to perform at least some processing related to the display. In one embodiment, display subsystem 830 includes a touchscreen device that provides both output and input to a user.

I/O controller 840 represents hardware devices and software components related to interaction with a user. I/O controller 840 may operate to manage hardware that is part of audio subsystem 820 and/or display subsystem 830. Additionally, I/O controller 840 illustrates a connection point for additional devices that connect to device 800 through which a user might interact with the system. For example, devices that may be attached to device 800 might include microphone devices, speaker or stereo systems, video systems or other display device, keyboard or keypad devices, or other I/O devices for use with specific applications such as card readers or other devices.

As mentioned above, I/O controller 840 may interact with audio subsystem 820 and/or display subsystem 830. For example, input through a microphone or other audio device may provide input or commands for one or more applications or functions of device 800. Additionally, audio output may be provided instead of or in addition to display output. In another example, if display subsystem includes a touchscreen, the display device also acts as an input device, which may be at least partially managed by I/O controller 840. There may also be additional buttons or switches on device 800 to provide I/O functions managed by I/O controller 840.

In one embodiment, I/O controller 840 manages devices such as accelerometers, cameras, light sensors or other environmental sensors, gyroscopes, global positioning system (GPS), or other hardware that may be included in device 800. The input may be part of direct user interaction, as well as providing environmental input to the system to influence its operations (such as filtering for noise, adjusting displays for brightness detection, applying a flash for a camera, or other features).

In one embodiment, device 800 includes power management 850 that manages battery power usage, charging of the battery, and features related to power saving operation. Memory subsystem 860 may include memory device(s) 862 for storing information in device 800. Memory subsystem 860 may include nonvolatile (state does not change if power to the memory device is interrupted) and/or volatile (state is indeterminate if power to the memory device is interrupted) memory devices. Memory 860 may store application data, user data, music, photos, documents, or other data, as well as system data (whether long-term or temporary) related to the execution of the applications and functions of system 800.

In one embodiment, memory subsystem 860 includes memory controller 864 (which could also be considered part of the control of system 800, and could potentially be considered part of processor 810). Memory controller 864 may communicate signaling to cause memory 862 to locally compare a data value stored at memory 862 to a reference value which is provided to memory 862.

Connectivity 870 may include hardware devices (e.g., wireless and/or wired connectors and communication hardware) and software components (e.g., drivers, protocol stacks) to enable device 800 to communicate with external devices. The device could be separate devices, such as other computing devices, wireless access points or base stations, as well as peripherals such as headsets, printers, or other devices.

Connectivity 870 may include multiple different types of connectivity. To generalize, device 800 is illustrated with cellular connectivity 872 and wireless connectivity 874. Cellular connectivity 872 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, LTE (long term evolution—also referred to as "4G"), or other cellular service standards. Wireless connectivity 874 refers to wireless connectivity that is not cellular, and may include personal area networks (such as Bluetooth), local area networks (such as WiFi), and/or wide area networks (such as WiMax), or other wireless communication. Wireless communication refers to transfer of data through the use of modulated electromagnetic radiation through a non-solid medium. Wired communication occurs through a solid communication medium.

Peripheral connections 880 include hardware interfaces and connectors, as well as software components (e.g., drivers, protocol stacks) to make peripheral connections. It will be understood that device 800 could both be a peripheral device ("to" 882) to other computing devices, as well as have peripheral devices ("from" 884) connected to it. Device 800 commonly has a "docking" connector to connect to other computing devices for purposes such as managing (e.g., downloading and/or uploading, changing, synchronizing) content on device 800. Additionally, a docking connector may allow device 800 to connect to certain peripherals that allow device 800 to control content output, for example, to audiovisual or other systems.

In addition to a proprietary docking connector or other proprietary connection hardware, device 800 may make peripheral connections 880 via common or standards-based connectors. Common types may include a Universal Serial Bus (USB) connector (which may include any of a number of different hardware interfaces), DisplayPort including MiniDisplayPort (MDP), High Definition Multimedia Interface (HDMI), Firewire, or other type.

In one implementation, a memory device comprises a memory array including a first memory location corresponding to a first address, an input/output (I/O) interface to couple the memory device to a memory controller, access logic including circuitry configured to receive via the I/O interface first signals from the memory controller, the first signals indicating the first address, and compare logic coupled to the access logic. Where the first signals indicate a compare operation, the access logic is to retrieve first data stored at the first location, and the compare logic is to perform a comparison of the first data and a reference data value of the first signals, and to send from the memory device information representing a result of the comparison.

In an embodiment, where the first signals indicate a read operation other than the compare operation, the access logic is to retrieve the first data and to send the first data from the memory device. In another embodiment, the first signals include a compare command. In another embodiment, the first signals include a control signal specifying that the compare operation is to be performed. In another embodiment, the information representing the result of the comparison is a single bit specifying whether the first data and the reference data value are equal to one another. In another embodiment, the information representing the result of the comparison includes a plurality of bits each corresponding to a respective pair of bits including a bit of the first data and a bit of the reference data value, the plurality of bits each indicating whether the corresponding pair of bits match one another. In another embodiment, the reference data value is communicated via a data bus interface of the memory device.

In another implementation, a memory controller comprises an input/output (I/O) interface to couple the memory controller to a memory device, and control logic including circuitry configured to send first signals via the I/O interface to the memory device, the first signals indicating a compare operation, a reference data value and a first address corresponding to a first location of a memory array of the memory device, wherein, in response to the first signals, the memory device performs a comparison of the reference data value and first data stored at the first location. The I/O interface is further to receive from the memory device, in response to the first signals, information representing a result of the comparison.

In an embodiment, the control logic is further to send second signals via the I/O interface to the memory device, the second signals indicating the first address and a read operation other than the compare operation, wherein, in response to the second signals, the memory device retrieves second data stored at the first location, and the I/O interface further to receive the second data from the memory device in response to the second signals. In another embodiment, the first signals include a compare command. In another embodiment, the first signals include a control signal specifying that the compare operation is to be performed. In another embodiment, the information representing the result of the comparison is a single bit specifying whether the first data and the reference data value are equal to one another. In another embodiment, the information representing the result of the comparison includes a plurality of bits each corresponding to a respective pair of bits including a bit of the first data and a bit of the reference data value, the plurality of bits each indicating whether the corresponding pair of bits match one another. In another embodiment, the reference data value is communicated via a data bus interface of the memory device.

In another implementation, a method at a memory device comprises receiving first signals from a memory controller coupled to the memory device, the first signals indicating a first address corresponding to a first location of a memory array of the memory device, and where the first signals indicate a compare operation, retrieving first data stored at the first location, performing a comparison of the first data and a reference data value of the first signals, and sending from the memory device information representing a result of the comparison In an embodiment, the method further comprises, where the first signals indicate a read operation other than the compare operation, retrieving first data stored at the first location, and sending the first data from the memory device. In another embodiment, the first signals include a compare command. In another embodiment, the first signals include a control signal specifying that the compare operation is to be performed. In another embodiment, the information representing the result of the comparison is a single bit specifying whether the first data and the reference data value are equal to one another. In another embodiment, the information representing the result of the comparison includes a plurality of bits each corresponding to a respective pair of bits including a bit of the first data and a bit of the reference data value, the plurality of bits each indicating whether the corresponding pair of bits match one another. In another embodiment, the reference data value is communicated via a data bus interface of the memory device.

In another implementation, a method at a memory controller comprises sending first signals to a memory device coupled to the memory controller, the first signals indicating a compare operation, a reference data value and a first address corresponding to a first location of a memory array of the memory device, wherein, in response to the first signals, the memory device performs a comparison of the reference data value and first data stored at the first location. The method further comprises receiving from the memory device, in response to the first signals, information representing a result of the comparison. In an embodiment, the method further comprises sending second signals to the memory device, the second signals indicating the first address and a read operation other than the compare operation, wherein, in response to the second signals, the memory device retrieves second data stored at the first location, and receiving the second data from the memory device in response to the second signals. In another embodiment, the first signals include a compare command. In another embodiment, the first signals include a control signal specifying that the compare operation is to be performed. In another embodiment, the information representing the result of the comparison is a single bit specifying whether the first data and the reference data value are equal to one another. In another embodiment, the information representing the result of the comparison includes a plurality of bits each corresponding to a respective pair of bits including a bit of the first data and a bit of the reference data value, the plurality of bits each indicating whether the corresponding pair of bits match one another. In another embodiment, the reference data value is communicated via a data bus interface of the memory device.

In another implementation, a computer-readable storage medium having stored thereon instructions which, when executed by one or more processing units, cause a memory controller to perform a method comprising sending first signals to a memory device coupled to the memory controller, the first signals indicating a compare operation, a reference data value and a first address corresponding to a first location of a memory array of the memory device, wherein, in response to the first signals, the memory device performs a comparison of the reference data value and first data stored at the first location. The method further comprises receiving from the memory device, in response to the first signals, information representing a result of the comparison.

In an embodiment, the method further comprises sending second signals to the memory device, the second signals indicating the first address and a read operation other than the compare operation, wherein, in response to the second signals, the memory device retrieves second data stored at the first location, and receiving the second data from the memory device in response to the second signals. In another embodiment, where the first signals indicate a read operation other than the compare operation, the access logic is to retrieve the first data and to send the first data from the memory device. In another embodiment, the first signals include a compare command. In another embodiment, the first signals include a control signal specifying that the compare operation is to be performed. In another embodiment, the information representing the result of the comparison is a single bit specifying whether the first data and the reference data value are equal to one another. In another embodiment, the information representing the result of the comparison includes a plurality of bits each corresponding to a respective pair of bits including a bit of the first data and a bit of the reference data value, the plurality of bits each indicating whether the corresponding pair of bits match one another. In another embodiment, the reference data value is communicated via a data bus interface of the memory device.

In another implementation, a system comprises a memory controller, an interconnect, and a memory device coupled to the memory controller via the interconnect. The memory device comprises a memory array including a first memory location corresponding to a first address, an input/output (I/O) interface to couple the memory device to a memory controller, access logic to receive via the I/O interface first signals from the memory controller, the first signals indicating the first address, and compare logic coupled to the access logic. Where the first signals indicate a compare operation, the access logic is to retrieve first data stored at the first location, and the compare logic is to perform a comparison of the first data and a reference data value of the first signals, and to send from the memory device information representing a result of the comparison.

In an embodiment, where the first signals indicate a read operation other than the compare operation, the access logic is to retrieve the first data and to send the first data from the memory device. In another embodiment, the first signals include a compare command. In another embodiment, the first signals include a control signal specifying that the compare operation is to be performed. In another embodiment, the information representing the result of the comparison is a single bit specifying whether the first data and the reference data value are equal to one another. In another embodiment, the information representing the result of the comparison includes a plurality of bits each corresponding to a respective pair of bits including a bit of the first data and a bit of the reference data value, the plurality of bits each indicating whether the corresponding pair of bits match one another. In another embodiment, the reference data value is communicated via a data bus interface of the memory device.

Techniques and architectures for operating a memory device are described herein. In the above description, for purposes of explanation, numerous specific details are set forth in order to provide a thorough understanding of certain embodiments. It will be apparent, however, to one skilled in the art that certain embodiments can be practiced without these specific details. In other instances, structures and devices are shown in block diagram form in order to avoid obscuring the description.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

Some portions of the detailed description herein are presented in terms of algorithms and symbolic representations of operations on data bits within a computer memory.

These algorithmic descriptions and representations are the means used by those skilled in the computing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the discussion herein, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Certain embodiments also relate to apparatus for performing the operations herein. This apparatus may be specially constructed for the required purposes, or it may comprise a general purpose computer selectively activated or reconfigured by a computer program stored in the computer. Such a computer program may be stored in a computer readable storage medium, such as, but is not limited to, any type of disk including floppy disks, optical disks, CD-ROMs, and magnetic-optical disks, read-only memories (ROMs), random access memories (RAMs) such as dynamic RAM (DRAM), EPROMs, EEPROMs, magnetic or optical cards, or any type of media suitable for storing electronic instructions, and coupled to a computer system bus.

The algorithms and displays presented herein are not inherently related to any particular computer or other apparatus. Various general purpose systems may be used with programs in accordance with the teachings herein, or it may prove convenient to construct more specialized apparatus to perform the required method steps. The required structure for a variety of these systems will appear from the description herein. In addition, certain embodiments are not described with reference to any particular programming language. It will be appreciated that a variety of programming languages may be used to implement the teachings of such embodiments as described herein.

Besides what is described herein, various modifications may be made to the disclosed embodiments and implementations thereof without departing from their scope. Therefore, the illustrations and examples herein should be construed in an illustrative, and not a restrictive sense. The scope of the invention should be measured solely by reference to the claims that follow.

What is claimed is:
1. A memory device comprising:
a memory array including a first memory location corresponding to a first address;
an input/output (I/O) interface to couple the memory device to a memory controller;

access logic including circuitry configured to receive via the I/O interface first signals from the memory controller, the first signals indicating the first address; and compare logic coupled to the access logic;

wherein, where the first signals indicate a compare operation:
the access logic to retrieve first data stored at the first location; and
the compare logic to perform a comparison of the first data and a reference data value of the first signals, and to send from the memory device information representing a result of the comparison, and wherein, where the first signals indicate a read operation other than the compare operation, the access logic to retrieve the first data and to send the first data from the memory device to the memory controller.

2. The memory device of claim 1, wherein a compare command of the first signals is to indicate the compare operation.

3. The memory device of claim 1, wherein a control signal of the first signals is to specify that the compare operation is to be performed.

4. The memory device of claim 1, wherein the information representing the result of the comparison is a single bit to specify whether the first data and the reference data value are equal to one another.

5. The memory device of claim 1, wherein the information representing the result of the comparison includes a plurality of bits each corresponding to a respective pair of bits including a bit of the first data and a bit of the reference data value, the plurality of bits each to indicate whether the corresponding pair of bits match one another.

6. The memory device of claim 1, wherein the reference data value is communicated via a data bus interface of the memory device.

7. A memory controller comprising:
an input/output (I/O) interface to couple the memory controller to a memory device; and
control logic including circuitry configured to send first signals via the I/O interface to the memory device, the first signals indicating a compare operation, a reference data value and a first address corresponding to a first location of a memory array of the memory device, wherein, in response to the first signals, the memory device performs a comparison of the reference data value and first data stored at the first location;
wherein the I/O interface further to receive from the memory device, in response to the first signals, information representing a result of the comparison, the control logic further to send second signals via the I/O interface to the memory device, the second signals indicating the first address and a read operation other than the compare operation, wherein, in response to the second signals, the memory device retrieves second data stored at the first location, and the I/O interface further to receive the second data from the memory device in response to the second signals.

8. The memory controller of claim 7, wherein a compare command of the first signals is to indicate the compare operation.

9. The memory controller of claim 7, wherein a control signal of the first signals is to specify that the compare operation is to be performed.

10. A method at a memory device, the method comprising:
receiving first signals from a memory controller coupled to the memory device, the first signals indicating a first address corresponding to a first location of a memory array of the memory device;
where the first signals indicate a compare operation:
retrieving first data stored at the first location;
performing a comparison of the first data and a reference data value of the first signals; and
sending from the memory device information representing a result of the comparison; and
where the first signals indicate a read operation other than the compare operation:
retrieving first data stored at the first location; and
sending the first data from the memory device to the memory controller.

11. The method of claim 10, wherein the first signals include a compare command.

12. The method of claim 10, wherein the first signals include a control signal specifying that the compare operation is to be performed.

13. A method at a memory controller, the method comprising:
sending first signals to a memory device coupled to the memory controller, the first signals indicating a compare operation, a reference data value and a first address corresponding to a first location of a memory array of the memory device, wherein, in response to the first signals, the memory device performs a comparison of the reference data value and first data stored at the first location;
receiving from the memory device, in response to the first signals, information representing a result of the comparisons;
sending second signals to the memory device, the second signals indicating the first address and a read operation other than the compare operation, wherein, in response to the second signals, the memory device retrieves second data stored at the first location; and
receiving the second data from the memory device in response to the second signals.

14. The method of claim 13, wherein the first signals include a compare command.

15. The method of claim 13, wherein the first signals include a control signal specifying that the compare operation is to be performed.

16. A non-transitory computer-readable storage medium having stored thereon instructions which, when executed by one or more processing units, cause a memory controller to perform a method comprising:
sending first signals to a memory device coupled to the memory controller, the first signals indicating a compare operation, a reference data value and a first address corresponding to a first location of a memory array of the memory device, wherein, in response to the first signals, the memory device performs a comparison of the reference data value and first data stored at the first location;
receiving from the memory device, in response to the first signals, information representing a result of the comparison;
sending second signals to the memory device, the second signals indicating the first address and a read operation other than the compare operation, wherein, in response to the second signals, the memory device retrieves second data stored at the first location; and
receiving the second data from the memory device in response to the second signals.

17. The computer-readable storage medium of claim 16, wherein, where the first signals indicate a read operation other than the compare operation, the access logic to retrieve the first data and to send the first data from the memory device.

18. The computer-readable storage medium of claim 16, wherein the first signals include a compare command.

19. The computer-readable storage medium of claim 16, wherein the first signals include a control signal specifying that the compare operation is to be performed.

20. The computer-readable storage medium of claim 16, wherein the information representing the result of the comparison includes a plurality of bits each corresponding to a respective pair of bits including a bit of the first data and a bit of the reference data value, the plurality of bits each indicating whether the corresponding pair of bits match one another.

* * * * *